(12) United States Patent
Jones

(10) Patent No.: US 6,507,209 B1
(45) Date of Patent: Jan. 14, 2003

(54) TESTER ACCURACY USING MULTIPLE PASSES

(75) Inventor: Christopher W. Jones, Pleasanton, CA (US)

(73) Assignee: Cypress Semiconductor Corp., San Jose, CA (US)

(*) Notice: Subject to any disclaimer, the term of this patent is extended or adjusted under 35 U.S.C. 154(b) by 49 days.

(21) Appl. No.: 09/850,806
(22) Filed: May 8, 2001
(51) Int. Cl.[7] .............................................. G01R 31/28
(52) U.S. Cl. ..................... 324/765; 324/158.1; 324/763; 324/73.1; 714/726; 714/729
(58) Field of Search .................................. 324/765, 754, 324/73.1, 158.1, 763, 633; 714/738, 32, 33, 37, 36, 39, 40, 57, 726–729, 724

(56) References Cited

U.S. PATENT DOCUMENTS 6,144,262 A * 11/2000 Kingsley .................... 324/633
6,158,032 A * 12/2000 Currier et al. .............. 324/763

* cited by examiner

Primary Examiner—Michael Sherry
Assistant Examiner—Jimmy Nguyen
(74) Attorney, Agent, or Firm—Christopher P. Maiorana, P.C.; John J. Ignatowski

(57) ABSTRACT

A test circuit generally comprising a tester connected to a socket for holding a device under test. The device may be configured to have (i) a first function and (ii) a final function. The tester may be configured to (i) stimulate the first function with a test signal to present a first output signal, (ii) stimulate the final function with the first output signal to present a final output signal; (iii) measure a result between the test signal and the final output signal, and (iv) allocate the result between the first function and the final function to disperse a measurement error in the result.

19 Claims, 3 Drawing Sheets

TESTER ACCURACY USING MULTIPLE PASSES

FIELD OF THE INVENTION

The present invention relates to a method and/or architecture for device testing generally and, more particularly, to device testing to an effective accuracy finer than the test equipment accuracy.

BACKGROUND OF THE INVENTION

Accuracy of semiconductor device testing is limited by an accuracy of the test equipment performing the test. For example, a test that determines if a propagation delay through a device meets or exceeds a 10 nanosecond (ns) requirement necessitates test equipment that can measure time intervals shorter than 10 ns. The test equipment commonly has an accuracy of one to two orders of magnitudes finer than the parameter being tested. For example, a 250 picosecond (ps) accuracy is suitable for measuring the 10 ns time interval in practical test situations.

The finite test equipment resolution results in uncertainties in the actual measurements. To guarantee that the device meets the 10 ns performance requirement, the actual device performance must exceed the requirement by the accuracy of the test equipment. In other words, the test equipment accuracy creates a guardband adjacent to the performance requirement that the device must exceed in order to pass the test. Consequently, a borderline device that meets the performance requirement but falls within the guardband fails the test due to errors induced by the test equipment. The guardband can be reduced by using more accurate and thus more expensive test equipment.

SUMMARY OF THE INVENTION

The present invention concerns a test circuit generally comprising a tester connected to a socket for holding a device under test. The device may be configured to have (i) a first function and (ii) a final function. The tester may be configured to (i) stimulate the first function with a test signal to present a first output signal, (ii) stimulate the final function with the first output signal to present a final output signal, (iii) measure a result between the test signal and the final output signal, and (iv) allocate the result between the first function and the final function to disperse a measurement error in the result.

The objects, features and advantages of the present invention include providing a method and/or architecture for device testing to an effective accuracy finer than the test equipment accuracy that may (i) reduce overall device testing time, (ii) effectively reduce test equipment induced measurement errors, and/or (iii) result in a higher device pass rate.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
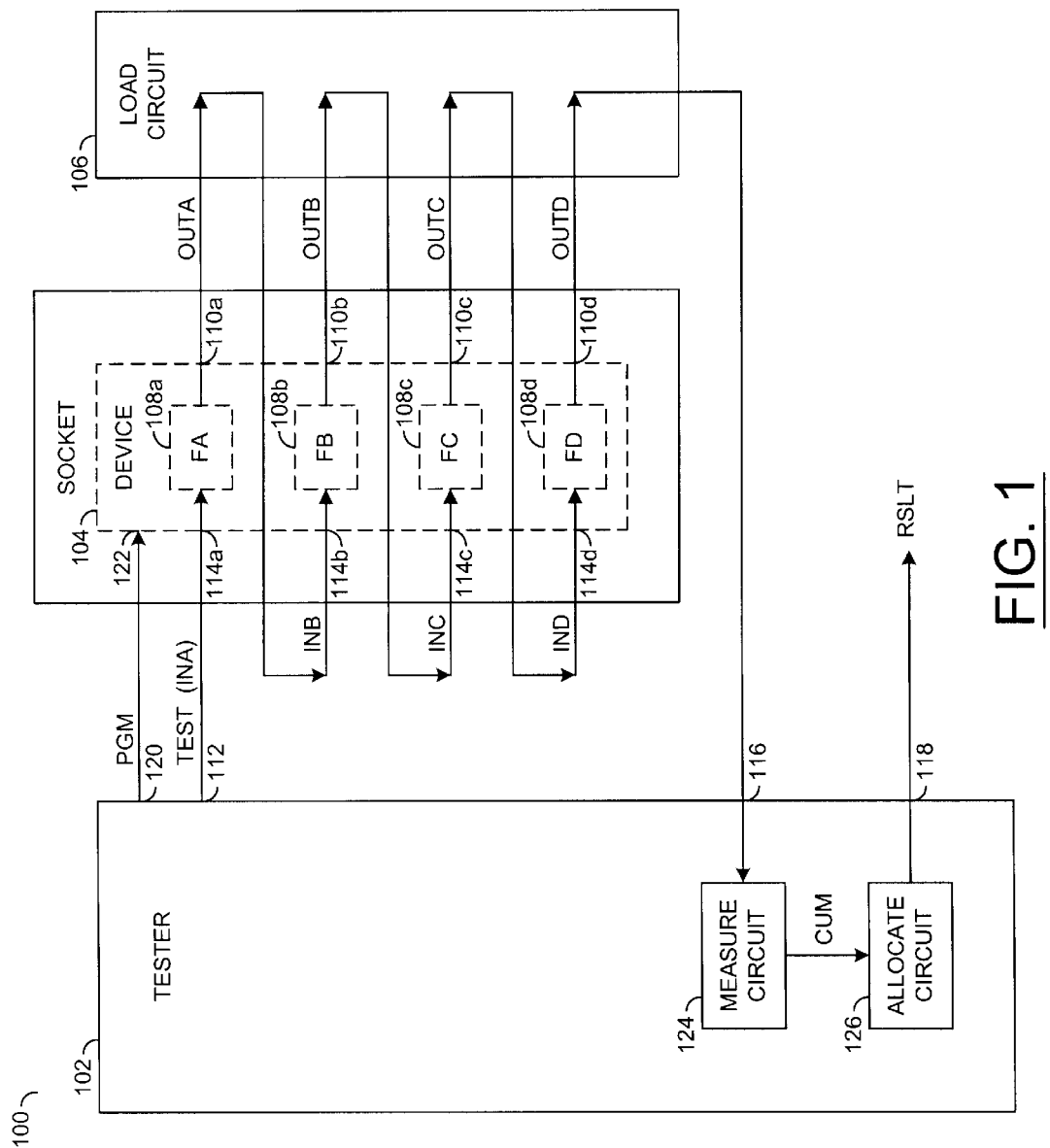
FIG. 1 is a block diagram of a test circuit.

Referring to FIG. 1, a block diagram of test circuit 100 is shown in accordance with a preferred embodiment of the present invention. The test circuit 100 generally comprises a tester 102, a socket 103 that may hold a device 104 under test, and a load circuit 106. The device 104 may have multiple functions, for example functions 108A–D. The functions 108A–D may be, but are not necessarily, similar copies of each other. The tester 102 may stimulate the device 104 and measure a result. The device 104 may have each of the functions 108A–D connected in series (e.g., output to input) such that the result for the device 104 is a summation of individual results for each function 108A–D. The tester 102 may allocate the results among the functions 108A–D as individual results. Any two or more functions 108 (not just 4 functions) may be interconnected to meet the test criteria of a particular test application. The load circuit 106 may provide electrical loading for outputs 110 of the device 104.

The tester 102 may have an output 112 to present a signal (e.g., TEST). The device 104 may have an input 114A to receive the signal TEST into the function 108A. The device 104 may have an 15 output 110A to present a signal (e.g., OUTA) to another input 114B associated with the function 108B. The device 104 may have an output 110B to present a signal (e.g., OUTB) to an input 114C associated with the function 108C. The device 104 may have an output 110C to present a signal (e.g., OUTC) to an input 114D associated with the function 108D. The device 104 may have an output 110D to present a signal (e.g., OUTD). The tester 102 may have an input 116 to receive the signal OUTD. The tester 102 may have another output 118 to present a signal (e.g., RSLT). The tester 102 may have an output 120 to present a signal (e.g., PGM) to an input 122 of the device 104.

The tester 102 may include a measurement circuit 124 and an allocation circuit 126. The measurement circuit 124 may present a signal (e.g., CUM) in response to receiving the signal OUTD. The allocation circuit 126 may present the signal RSLT as an allocation of the signal CUM to the functions 108A–D. In one embodiment, the allocation circuit 126 may be implemented externally and independently of the tester 102.

The signal TEST may be implemented as a test signal. The signal TEST may convey a parameter of interest (e.g., P). The parameter P may include, but is not limited to an absolute value and/or change in a time interval, an amplitude, a frequency, a phase, a bandwidth, a gain, an attenuation, a distortion factor, noise and the like. The signal TEST may be used to stimulate a first function (e.g., function 108A) of the device 104. The signal TEST may be generated independently of the signal OUTD.

The signal OUTA may be implemented as an output signal for the function 108A. The function 108A may present the signal OUTA in response to receiving the signal TEST. The function 108A may modify the parameter P in the signal TEST to present a parameter (e.g., PA) in the signal OUTA. The signal OUTA may also be an input signal for the function 108B.

The signal OUTB may be implemented as an output signal for the function 108B. The function 108B may present the signal OUTB in response to receiving the signal OUTA. The function 108B may modify the parameter PA in the signal OUTA to present a parameter (e.g., PB) in the signal OUTB. The signal OUTB may also be an input signal for the function 108C.

The signal OUTC may be implemented as an output signal for the function 108C. The function 108C may present the signal OUTC in response to receiving the signal OUTB. The function 108C may modify the parameter PB in the signal OUTB to present a parameter (e.g., PC) in the signal OUTC. The signal OUTC may also be an input signal for the function 108D.

The signal OUTD may be implemented as an output signal for the function 108D. The function 108D may present the signal OUTD in response to receiving the signal OUTC. The function 108D may modify the parameter PC in the signal OUTC to present a parameter (e.g., PD) in the signal OUTD. The signal OUTD may also be an input signal for the tester 102.

The signal CUM may be implemented as a cumulative result signal. In general, the signal CUM may be a measurement of a final output signal presented by a final function 108 of the device 104. For example, the signal CUM may be a measurement of the signal OUTD. In practice, the measurement circuit 124 may introduce an error (e.g., ERR) into the measurement of the signal OUTD (e.g., CUM=OUTD+ERR). The error ERR may define an accuracy or resolution of the tester 102.

The signal RSLT may be implemented as an individual result signal. The signal RSLT may be an allocation of the signal CUM to the functions 108A–D. In one embodiment, the signal RSLT may be a single value allocated to all of the functions 108A–D. In another embodiment, the signal RSLT may be several signals, one for each function 108A–D. Other allocations of the signal RSLT among the functions 108A–D may be provided to meet a criteria of a particular test application.

The signal PGM may be implemented as a programming signal. The signal PGM may be used to initialize, program, load, configure, or otherwise prepare the device 104 for testing. Preparation of the device 104 for testing may include defining, programming, and/or initializing the functions 108A–D.

Consider a case where the functions 108A–D are designed to be identical to each other. Each function 108A–D may contribute an equal amount to the parameter PD within the signal OUTD. Given that the measured results for all four functions 10BA–D is the signal CUM, then the measured result for each individual function 108A–D may be defined as the signal CUM divided by 4 (e.g., CUM/4). Likewise, the error ERR embedded within the signal CUM may be allocated to each function 108A–D in equal portions (e.g., ERR/4). The signal RSLT is thus a portion of the signal OUTD plus the portion of the signal ERR (e.g., RSLT= OUTD/4+ERR/4). In effect, the tester 102 may measure each function 108A–D with an effective accuracy (e.g., ERR/4) that is finer than an actual accuracy (e.g., ERR). The finer effective accuracy of the tester 102 may result in a smaller guardband than if each function 108A–D were tested alone.

Consider a case where the individual functions 108A–D are designed to be different from each other. Each function 108A–D may contribute a different amount to the parameter PD of the signal OUTD. Allocation of the signal RSLT to the individual functions 108A–D may require allocating different fractions of the signal CUM proportional to the designed differences of the functions 108A–D. For example, if the function 108D is designed such that the parameter of interest is twice that of the other functions 108A–C, then ⅕ of the signal CUM (including the error ERR) may be allocated to the signal RSLT for each of the functions 108A–C and ⅖ths of the signal CUM (including the error ERR) may be allocated to the signal RSLT for the function 108D.

Figure 2:
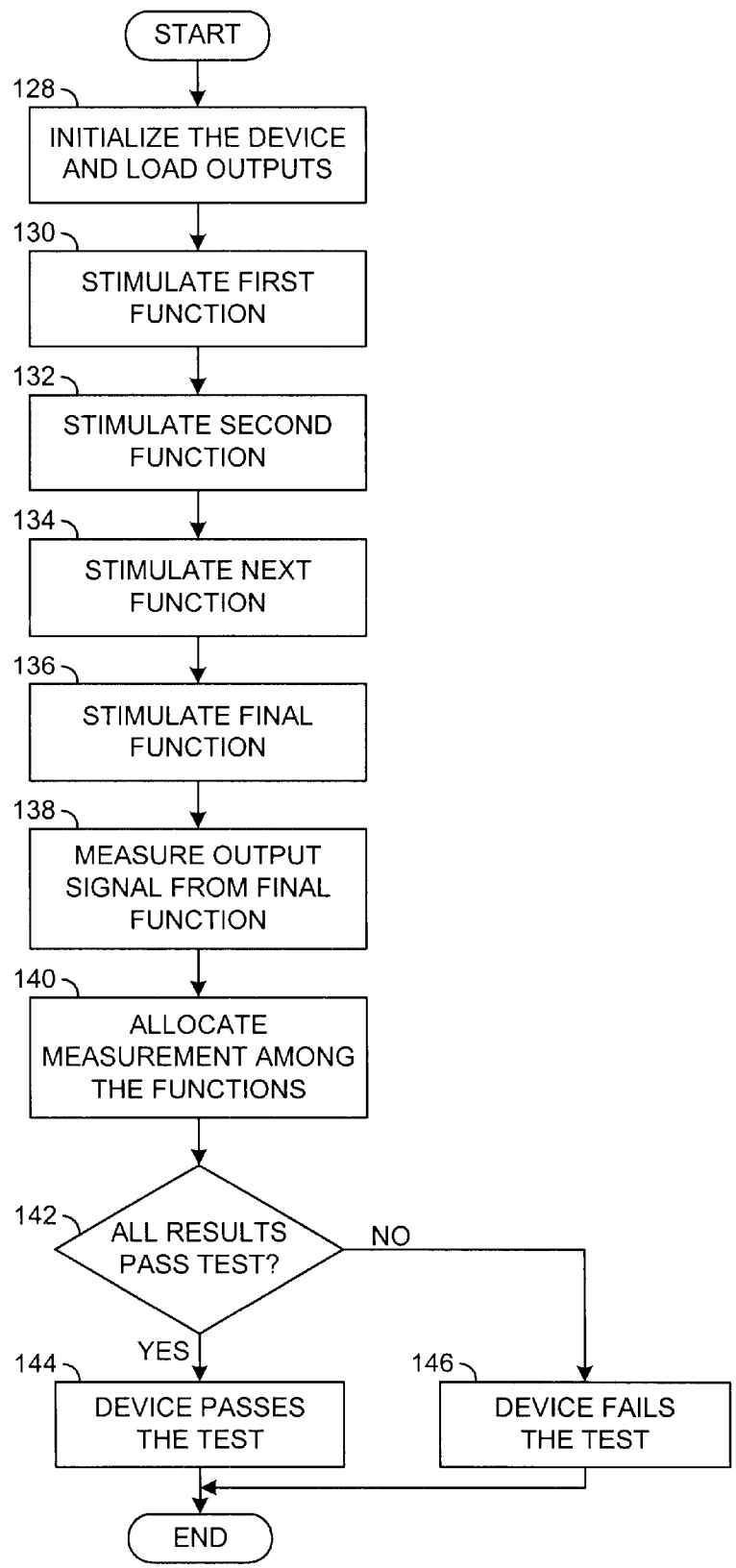
FIG. 2 is a flow diagram for a method of testing.

Referring to FIG. 2, a flow diagram of a method of testing is shown. The method may start by initializing the device 104 and loading the output 110 of the device 104 (e.g., block 128). The tester 102 may then stimulate the first function 108A of the device with the signal TEST (e.g., block 130). The first function 108A may present the signal OUTA in response to the signal TEST. The signal OUTA may then stimulate the second function 108B (e.g., block 132). The second function 108B may present the signal OUTB in response to the signal OUTA.

The process described above may continue to the third function 108C and beyond, if additional functions 108 are connected in series. Generally, each function 108 may be stimulated by a previous function 108 (e.g., block 134). Eventually, a final function 108X (where X may be B or higher) may be stimulated (e.g., block 136). The tester 102 may then measure the signal OUTX from the final function 108X (e.g., block 138) to produce the signal CUM. The tester 102 may introduce the error ERR into the signal CUM during the process of measuring the signal OUTX.

The signal CUM may then be allocated among the functions 108 (e.g., block 140) as the signal RSLT. The signal RSLT may then be checked against a requirement (e.g., decision block 142). The device 104 may pass the test if the signal RSLT meets or exceeds the requirement by the allocated error ERR (e.g., block 144), else the device 104 may fail the test (e.g., block 146).

The test circuit 100 may be used to test a variety of devices 104. For example, the device 104 may include, but is not limited to programmable logic devices, complex programmable logic devices, programmable gate arrays, application specific integrated circuits, memories, amplifiers, attenuators, filters, and the like. The device 104 may be programmable or non-programmable. The device 104 may operate in a digital domain, an analog domain, a time domain, a frequency domain, and/or a phase domain. The device 104 may have an input-function-output type arrangement where the input signal and the output signal are routed externally to the device 104.

The input signals and the output signals for the functions 108 may be similar or different in nature depending upon a transformation performed by the functions 108. For example, the input signal and the output signal may be similar in nature where the functions 108 are filters. The input signal to a particular filter may be a sine waveform used to stimulate the filter. Likewise, the output signal from the particular filter may also be a sine waveform of a different amplitude. The sine waveform presented by the particular filter may be used to stimulate a next filter along a daisy-chain of filters.

The input signal and the output signal may be different in nature. For example, the input signal may be all or part of an address received by an asynchronous memory device. The output signal may be all or part of a data presented by the asynchronous memory device. Through proper programming and routing the data back to the address, the asynchronous memory device may sequence through several memory address locations in rapid order during a test. A speed of the sequence may be limited by a time delay between a change in the address to a change in the data.

Where the parameter of interest is a time interval, the functions 108 having clocked registers may not be well suited for testing according to the present invention. The clocked registers generally render a propagation delay from the input 114 to the output 110 meaningless. The input signal propagating through a function 108 of the device 104 may be halted for unknown time intervals upon encountering each clocked register. Since there is no way of measuring how long each clocked register halts or delays the input signal, then there is no method of determining a total delay from the input 114 to the output 110 independent of the clock. An exception may be made where the clock signal is the input signal.

Figure 3:
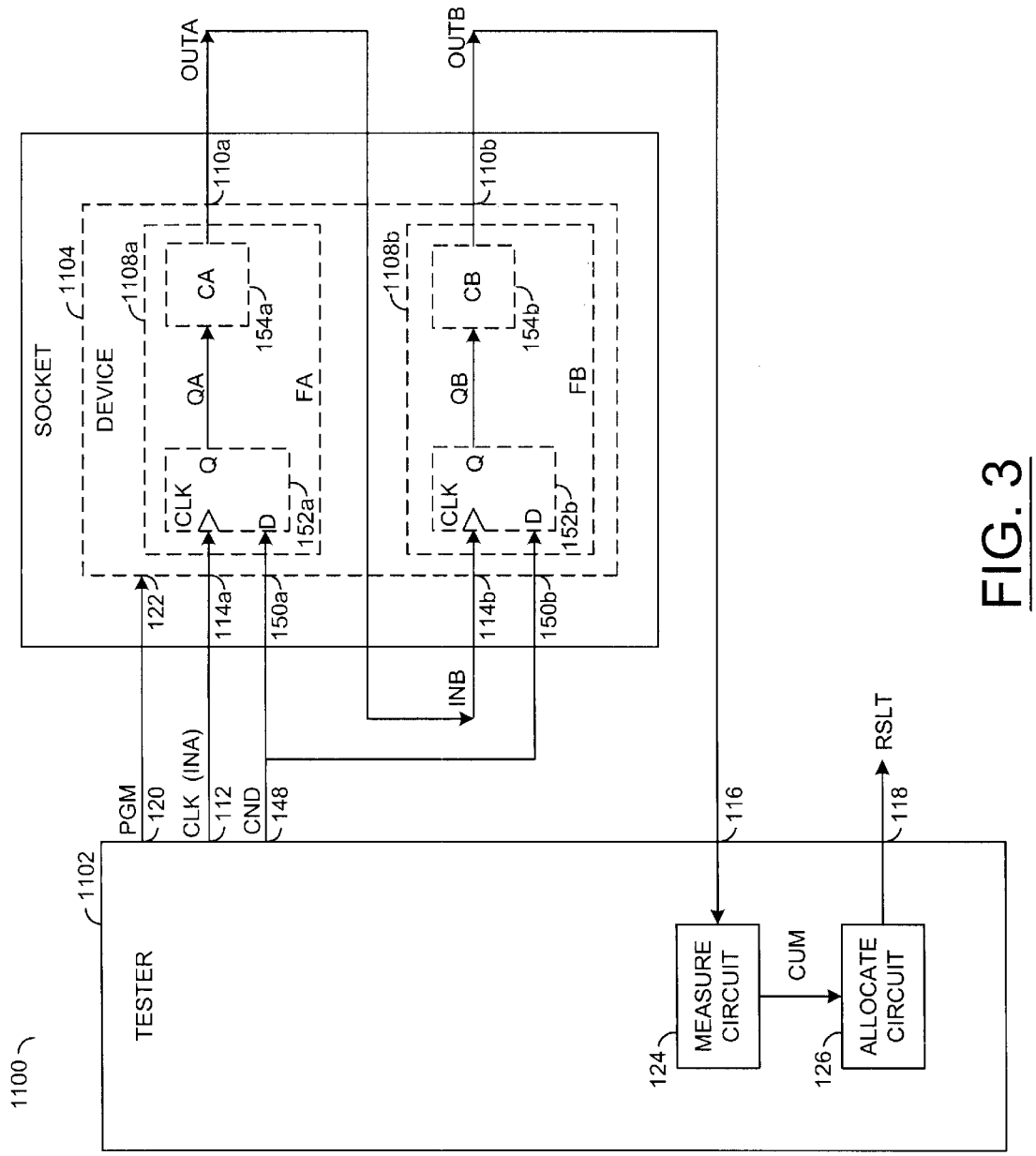
FIG. 3 is a block diagram of another test circuit.

Referring to FIG. 3, a block diagram of another test circuit 1100 is shown. The test circuit 1100 may include a tester 1102 and a socket 1103 for holding a device 1104. The device 1104 may include functions 1108 having clocked registers.

The tester 1102 may present the signal TEST as a signal (e.g., CLK) and another signal (e.g., CND). The tester 1102 may have the output 112 to present the signal CLK. The tester 1102 may have an output 148 to present the signal CND. A function 1108A may have the input 114A to receive the signal TEST and another input 150A to receive the signal CND. The function 1108A may have the output 110A to present the signal OUTA. A function 1108B may have an input 114B to receive the signal OUTA and another input 150B to receive the signal CND.

Each function 1108A–B may comprise a register 152 and a circuit 154. The register 152A may receive the signal CLK as a clock signal and the signal CND as a data signal. The register 152A may present a signal (e.g., QA) to the circuit 154A. The circuit 154A may present the signal OUTA in response to the signal QA. The register 152B may receive the signal OUTA as a clock signal and the signal CND as a data signal. The register 152B may present a signal (e.g., QB) to the circuit 154B. The circuit 154B may present the signal OUTB in response to the signal QB. The tester 1102 may measure the signal OUTB.

The signal CLK may be implemented as a clock signal suitable for the registers 152A–B. The signal CND may be implemented as a test condition signal. The signal CND may be presented to cause the signals QA and QB to behave similar to the signal CLK. If the registers 152A–B are "D" type flip-flops, then the signal CND may be a bit set to a logical one value or a logical zero value as required. If the registers 152A–B are other types of flip-flops, then the signal CND may be presented accordingly to cause the signals QA and QB to behave as clock signals.

The various signals of the present invention are generally shown on individual inputs and outputs. In other embodiments, some or all of the various signals may be multiplexed through one or more inputs and/or outputs as desired or required.

While the invention has been particularly shown and described with reference to the preferred embodiments thereof, it will be understood by those skilled in the art that various changes in form and details may be made without departing from the spirit and scope of the invention.

What is claimed is:

1. A test circuit comprising:
   a socket for holding a device under test, said device being configured to have (i) a first function and (ii) a final function; and
   a tester configured to (i) stimulate said first function with a test signal to present a first output signal, (ii) stimulate said final function with said first output signal to present a final output signal, (iii) measure a result between said test signal and said final output signal, and (iv) allocate said result to between said first function and said final function to disperse a measurement error in said result.

2. The test circuit according to claim 1, wherein said tester is further configured to program said device prior to stimulating said first function.

3. The test circuit according to claim 1, wherein said tester is further configured to pass said device in response to said result plus said measurement error being less than a sum of a guaranteed parameter value for each of said functions.

4. The test circuit according to claim 1, further comprising a load circuit configured to load each output of said device.

5. The test circuit according to claim 1, wherein said tester is further configured to stimulate a second function of said device with Said first output signal to present a second output signal and stimulate said final function with said second output signal.

6. The test circuit according to claim 1, wherein said test signal is independent of said final output signal.

7. The test circuit according to claim 1, wherein said result is a measurement of one of a time interval, a noise, a distortion, an amplitude, a phase shift, a frequency shift, a bandwidth, an attenuation, and a gain.

8. The test circuit according to claim 1, wherein said functions of said device are unclocked.

9. The test circuit according to claim 1, wherein said functions of said device are clocked.

10. A test circuit comprising:
    means for stimulating a first function of a device with a test signal to present a first output signal;
    means for stimulating a final function of said device with said first output signal to present a final output signal;
    means for measuring a result based upon said final output signal relative to said test signal; and
    means for allocating said result between said first function and said final function to disperse a measurement error in said result.

11. A method of testing a device comprising the steps of:
    (A) stimulating a first function of said device with a test signal to present a first output signal;
    (B) stimulating a final function of said device with said first output signal to present a final output signal;
    (C) measuring a result based upon said final output signal relative to said test signal; and
    (D) allocating said result between said first function and said final function to disperse a measurement error in said result.

12. The method according to claim 11, further comprising the step of programming said device to establish said functions prior to step (A).

13. The method according to claim 11, further comprising the step of passing said device in response to said result plus a measurement uncertainty being less than a sum of a guaranteed parameter value for each of said functions.

14. The method according to claim 11, further comprising the step of loading each output of said device at which said output signals are presented.

15. The method according to claim 11, further comprising the step of stimulating a second function with said first output signal to present as second output signal, wherein step (B) is stimulating said final function with said second output signal.

16. The method according to claim 11, wherein said test signal is independent of said final output signal.

17. The method according to claim 11, wherein measuring said result is measuring one of a time interval, a noise, a distortion, an amplitude, a phase shift, a frequency shift, a bandwidth, an attenuation, and a gain.

18. The method according to claim 11, wherein said functions are unclocked.

19. The method according to claim 11, wherein said functions are clocked.

* * * * *